US008236433B2

(12) United States Patent
Chiu et al.

(10) Patent No.: US 8,236,433 B2
(45) Date of Patent: Aug. 7, 2012

(54) ANTIREFLECTION STRUCTURE AND MANUFACTURING METHOD THEREOF

(75) Inventors: Po-Kai Chiu, Hsinchu (TW); Wen-Hao Cho, Hsinchu (TW); Hung-Ping Chen, Yongkang (TW); Han-Chang Pan, Taichung (TW); Chien-Nan Hsiao, Fongyuan (TW)

(73) Assignee: National Applied Research Laboratories, Taipei (TW)

( * ) Notice: Subject to any disclaimer, the term of this patent is extended or adjusted under 35 U.S.C. 154(b) by 383 days.

(21) Appl. No.: 12/238,652

(22) Filed: Sep. 26, 2008

(65) Prior Publication Data

US 2009/0246514 A1 Oct. 1, 2009

(30) Foreign Application Priority Data

Mar. 26, 2008 (TW) .............................. 97110886 A

(51) Int. Cl.
*B32B 15/01* (2006.01)
*C23C 28/00* (2006.01)

(52) U.S. Cl. ........ 428/699; 428/426; 428/432; 428/688; 428/701; 428/702; 427/248.1; 427/255.15; 427/255.19; 427/255.7; 427/402; 427/419.1; 427/419.3

(58) Field of Classification Search .................. 428/432, 428/426, 688, 699, 701, 702; 427/248.1, 427/255.15, 255.19, 255.7, 402, 419.1, 419.3
See application file for complete search history.

(56) References Cited

U.S. PATENT DOCUMENTS

| 4,904,083 | A  | * | 2/1990  | Lu et al. .................. 356/469 |
| 5,939,189 | A  | * | 8/1999  | Phillips et al. ............ 428/336 |
| 6,771,420 | B2 | * | 8/2004  | Ozawa et al. .............. 359/586 |
| 2001/0031365 | A1 | * | 10/2001 | Anderson et al. .......... 428/432 |
| 2002/0048087 | A1 | * | 4/2002  | Mitsuishi et al. .......... 359/580 |
| 2002/0060848 | A1 | * | 5/2002  | Mitsuishi et al. .......... 359/586 |
| 2002/0181108 | A1 | * | 12/2002 | Macchi et al. ............. 359/580 |
| 2003/0021033 | A9 | * | 1/2003  | Mitsuishi et al. .......... 359/586 |
| 2004/0005482 | A1 | * | 1/2004  | Kobayashi et al. ......... 428/702 |
| 2004/0027672 | A1 | * | 2/2004  | Bourdelais et al. ........ 359/586 |
| 2004/0075910 | A1 | * | 4/2004  | Shozude et al. ........... 359/603 |
| 2004/0076835 | A1 | * | 4/2004  | Watanabe ................. 428/432 |
| 2004/0146723 | A1 | * | 7/2004  | Mitsuishi et al. .......... 428/447 |
| 2007/0188871 | A1 | * | 8/2007  | Fleury et al. .............. 359/586 |

* cited by examiner

*Primary Examiner* — Jennifer McNeil
*Assistant Examiner* — Lauren Robinson
(74) *Attorney, Agent, or Firm* — Volpe and Koenig, P.C.

(57) ABSTRACT

An antireflection structure is provided. The antireflection structure includes a substrate layer having a substrate refractive index; a first inorganic layer disposed on the substrate layer and having a first refractive index different from the substrate refractive index, where a thickness of the first inorganic layer is in a range of 1 to 40 nm; and a second inorganic layer disposed on the first inorganic layer and having a second refractive index different from the first refractive index.

20 Claims, 6 Drawing Sheets

ANTIREFLECTION STRUCTURE AND MANUFACTURING METHOD THEREOF

FIELD OF THE INVENTION

The present invention relates to an antireflection structure and a manufacturing method thereof, and more particularly to an antireflection structure and a manufacturing method thereof with the reductions in the coating time and the material cost.

BACKGROUND OF THE INVENTION

Currently, the optical elements have been widely applied, and therefore the demand of the antireflection films becomes greater and greater in order to decrease the reflectance and to increase the transmittance of light after passing through the optical elements. Several methods for forming the antireflection films are available, including physical and chemical vapor deposition methods. Currently, most optical coatings are done by the physical vapor deposition. The vapor deposition is a coating technique, and is operated in a vacuum condition by heating the coating material source up to its melting or evaporating temperature, so the coating material is evaporated and then deposited onto the surface of the substrate. During the deposition process, the substrate is usually heated, so the evaporated atoms or molecules have enough energy to move on the surface of the substrate, and therefore the films can be evenly formed. Consequently, the temperature of the substrate has an important influence on the properties of the deposited films. Generally, if the glass substrate is used, the substrate is heated up to 300° C. so as to form good bonding between the films and the substrate to avoid peeling.

The conventional antireflection films are usually done by depositing at least two film layers with different refractive indexes on a transparent substrate. Usually more than three layers are superposed on the substrate, and therefore the optical interferences among the multiple layers can be applied to reduce the reflected light. Although the vapor deposition has the advantages of the high deposition rate and the convenience to form the multiple layers, however the substrate material unable to resist the high heat is not suitable for use in this method due to the concern of the high operation temperature during processes. For example, conventionally the coated films on the plastic substrate mostly contain one or two layers due to the low resistance to high heat for the plastic substrate. Accordingly the antireflection effect is limited owing to the too few coated layers. If more layers are coated on the plastic substrate, the phenomena of the poor adherence or even peeling and cracking occur.

In order to eliminate the drawbacks of the conventional techniques, the new concepts and the solutions are proposed in the present invention so as to solve the above-mentioned problems. The present invention is described below.

SUMMARY OF THE INVENTION

The present invention provides an antireflection film and a manufacturing method thereof with the excellent antireflection effect, the shortened coating time and the reduced material cost. Moreover, based on the concept of the present invention, the antireflection film of the present invention can be applied in much wider fields.

In accordance with one aspect of the present invention, an antireflection structure is provided. The antireflection structure includes a substrate layer having a substrate refractive index, a first inorganic layer disposed on the substrate layer and having a first refractive index different from the substrate refractive index, where a thickness of the first inorganic layer is in a range of 1 to 40 nm, and a second inorganic layer disposed on the first inorganic layer and having a second refractive index different from the first refractive index.

Preferably, the antireflection structure further includes a third inorganic layer disposed on the second inorganic layer and having a third refractive index different from the second refractive index, where a thickness of the third inorganic layer is in a range of 1 to 40 nm, and a fourth inorganic layer disposed on the third inorganic layer and having a fourth refractive index different from the third refractive index.

In accordance with another aspect of the present invention, an antireflection structure is provided. The antireflection structure includes a substrate layer having a substrate refractive index, a first transparent layer disposed on the substrate layer and having a first refractive index, and a second transparent layer disposed on the first transparent layer and having a second refractive index, where the first refractive index is larger than the substrate refractive index and the second refractive index, and a thickness of the first transparent layer is in the range of 1 to 40 nm.

Preferably, the antireflection structure further includes a third transparent layer disposed on the second transparent layer and having a third refractive index, and a fourth transparent layer disposed on the third transparent layer and having a fourth refractive index, where the third refractive index is larger than the second and fourth refractive indexes, and a thickness of the third transparent layer is in the range of 1 to 40 nm.

Preferably, the third transparent layer is made of a metal oxide.

Preferably, the fourth refractive index is smaller than the substrate refractive index.

Preferably, the third and fourth transparent layers are made by a method of a vapor deposition.

Preferably, the first transparent layer is made of a metal oxide.

Preferably, the metal oxide is one selected from a group consisting of indium oxide, titanium dioxide, nickel oxide, chromium oxide, cadmium oxide, gallium indium oxide, diniobium pentaoxide, indium tin oxide, tin dioxide and a combination thereof.

Preferably, the second refractive index is smaller than the substrate refractive index.

Preferably, the first and the second transparent layers are made by a method of a vapor deposition.

In accordance with a further aspect of the present invention, a method for manufacturing an antireflection structure is provided. The method for manufacturing an antireflection structure includes steps of providing a substrate layer with a substrate refractive index, forming a first transparent layer with a first refractive index on the substrate layer, and forming a second transparent layer with a second refractive index on the first transparent layer, where the first refractive index is larger than the substrate refractive index and the second refractive index, and a thickness of the first transparent layer is in the range of 1 to 40 nm.

Preferably, the method for manufacturing an antireflection structure further includes steps of forming a third transparent layer with a third refractive index on the second transparent layer, and forming a fourth transparent layer with a fourth refractive index on the third transparent layer, where the third refractive index is larger than the second and the fourth refractive indexes, and a thickness of the third transparent layer is in the range of 1 to 40 nm.

Preferably, a method of forming the first, the second, the third and the fourth transparent layers includes at least one selected from a group consisting of a coating, a physical vapor deposition and a chemical vapor deposition method.

Preferably, the method for manufacturing an antireflection structure further includes at least one of steps of forming a coating layer between any the two layers, and forming an adhesive layer between any the two layers.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
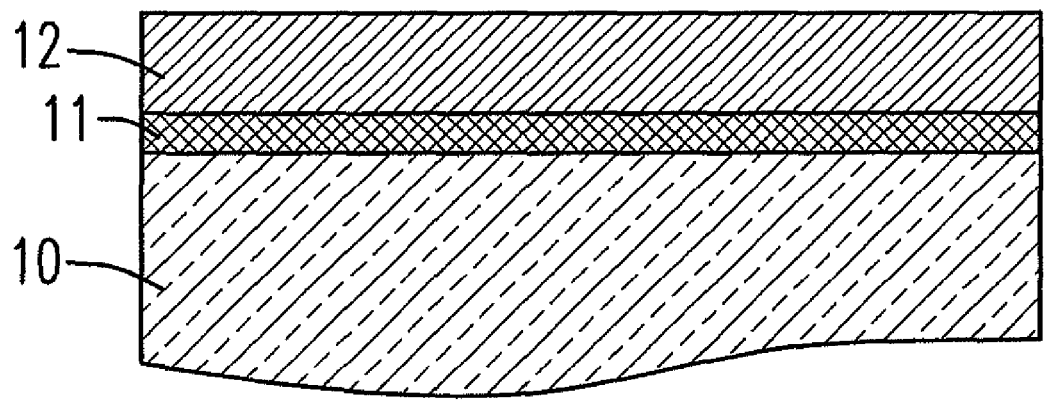
FIG. 1 is the schematic diagram showing the side view of the antireflection films according to the first embodiment of the present invention.
Figure 2:
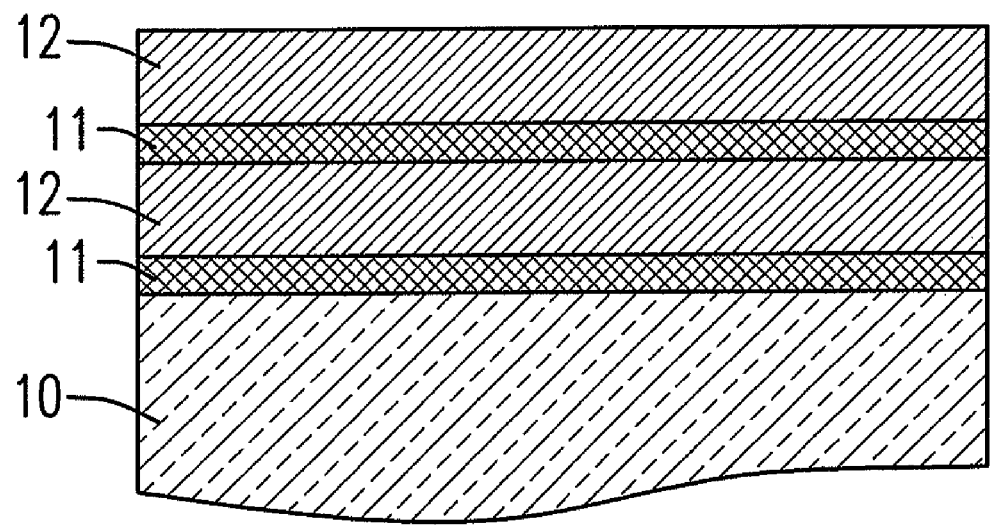
FIG. 2 is the schematic diagram showing the side view of the antireflection films according to the second embodiment of the present invention.

Please refer to FIGS. 1 and 2, which are the schematic diagrams showing the side views of the antireflection films according to the first and the second embodiments of the present invention. The antireflection films 1 and 2 respectively include a substrate 10 and multiple-layer transparent films. The material of the substrate 10 is not specifically limited. The examples in the present invention include cloth, fibers, paper, PVC (polyvinyl chloride) sheets, polymer sheets, and other flexible substrate materials. The multiple-layer transparent films containing the alternating layers with high and low refractive indexes are formed on the substrate 10. The material of the layer directly contacted with the substrate 10 usually has the higher refractive index than that of the substrate 10. In this embodiment, titanium oxide ($TiO_2$) is chosen as the material of the layer 11. Other materials with high refractive indexes, e.g. indium oxide, nickel oxide, chromium oxide, cadmium oxide, gallium indium oxide, diniobium pentaoxide, indium tin oxide, tin dioxide, etc. can be used as well. It is better to choose the material with the lower refractive index than that of the titanium oxide layer 11 as the material used in the layer above the titanium oxide layer 11. In this embodiment, silicon dioxide ($SiO_2$) is selected as the material of the layer 12. Generally, the more layers for the transparent films are, the more significant effect for the antireflection will be. Therefore, the antireflection films 1 in the first embodiment can be further coated by two more alternating $TiO_2$ layer 11 and $SiO_2$ layer 12 so as to reach the better antireflection effect, as shown in FIG. 2.

One of the special characteristic of the present invention is to adopt the ultra thin $TiO_2$ layer 11. Generally, the thickness of the single transparent layer is in the range of 50-100 nanometers (nm). By contrast, the thickness of the transparent $TiO_2$ layer is only 1-40 nm, preferably 10-35 nm.

Figure 3:
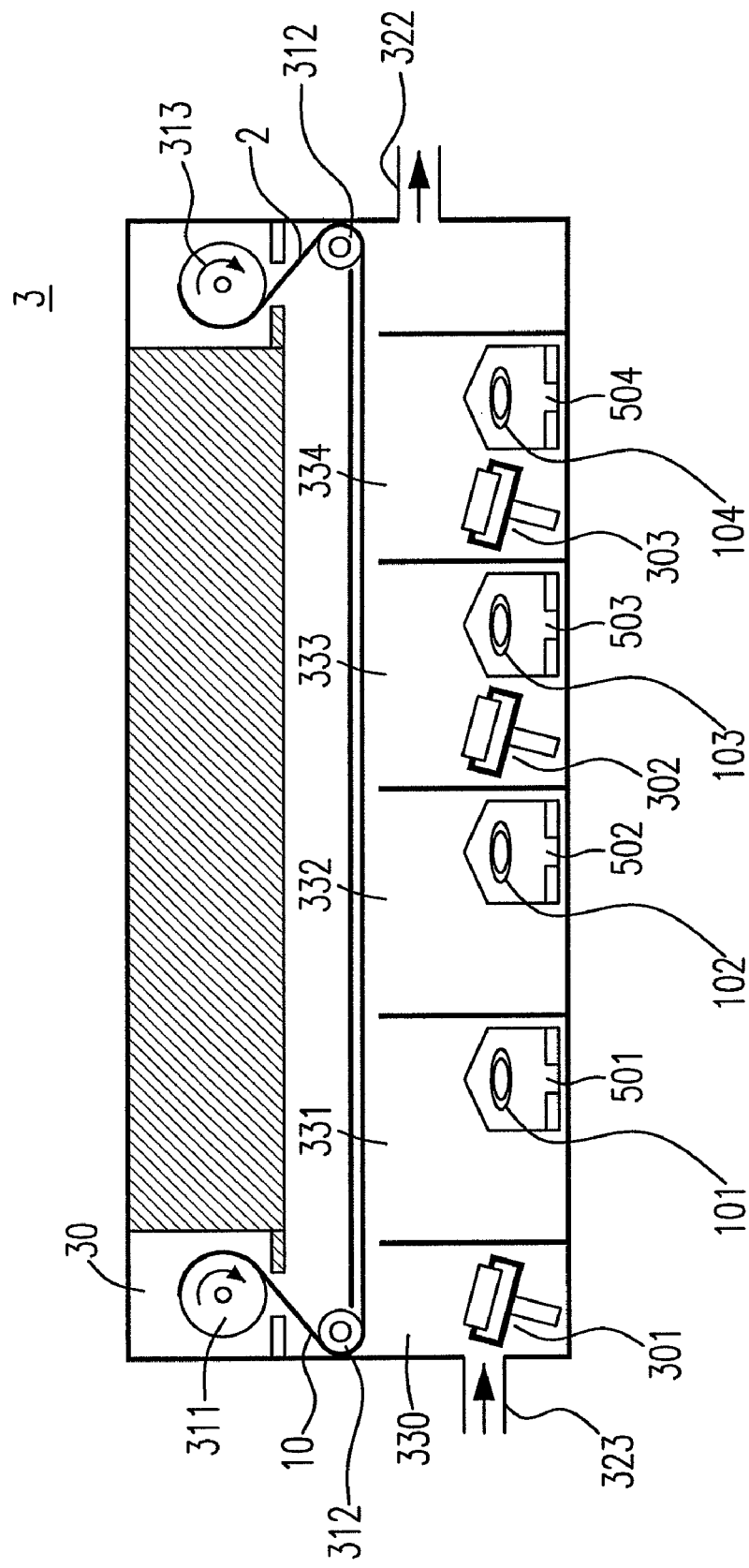
FIG. 3 is the schematic diagram showing the manufacturing method of the antireflection films according to the second embodiment of the present invention.

Please refer to FIG. 3, which is the schematic diagram showing the manufacturing method of the antireflection films according to the second embodiment of the present invention. In this embodiment, the method of the ion beam assisted vapor deposition is utilized to deposit the layer structure of $TiO_2/SiO_2$ on the plastic substrate. In this embodiment, the antireflection films 2 coated on the substrate 10 are continuously and automatically manufactured by the processing machine 3 as shown in FIG. 3. The manufacturing method includes the following steps.

The processing machine 3 is set up for the continuous and automatic manufacture of the antireflection films 2.

Firstly, the substrate 10 to be processed is loaded. The substrate 10 is rolled into a roll set, which is loaded on the substrate carrying wheel 311 inside the vacuum chamber 30.

Figure 4:
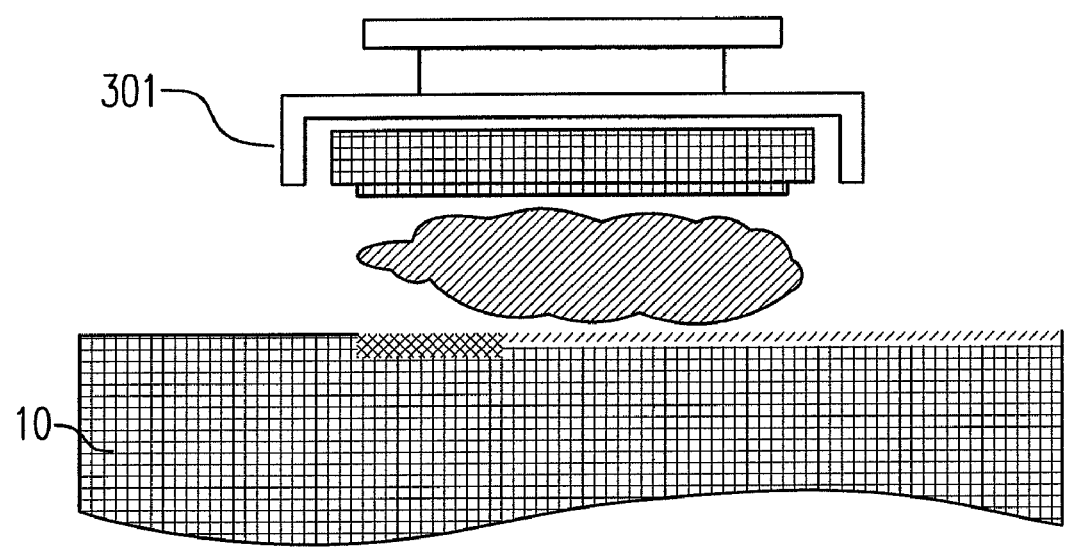
FIG. 4 is the schematic diagram showing the pre-cleaning process of the manufacturing method of the antireflection films according to the present invention.

Next, the pre-cleaning process is performed. Please refer to FIGS. 3 and 4. FIG. 4 is the schematic diagram showing the pre-cleaning process of the manufacturing method of the antireflection films according to the present invention. After the substrate 10 is loaded on the substrate carrying wheel 311, the vacuum pump is turned on, and the gas is extracted through the pipe 322. After the pressure of the vacuum chamber 30 is decreased below $8 \times 10^{-6}$ torr, the oxygen is input through the inlet pipe 323 until the pressure of $2.4 \times 10^{-4}$ torr is reached. Then the pre-cleaning process is ready to proceed. The advancing speed of the substrate 10 is adjusted before the substrate enters the pre-cleaning area 330. At the same time, the $TiO_2$ coating material 101 and the $SiO_2$ coating material 102 are heated to be melted. When the substrate 10 enters the pre-cleaning area 330, the ion source 301 is turned on to perform the pre-cleaning treatments on the substrate 10, as shown in FIG. 4. The pre-cleaning process can enhance the adherence property of the surface of the substrate 10, which will facilitate the following vapor deposition processes.

Subsequently, the coated films are formed. Please refer to FIG. 3. The substrate 10 after pre-cleaning process is transported to the first vapor deposition area 331 by the guide wheel 312. In the first vapor deposition area 331, the first heating source 501 is used to heat the $TiO_2$ coating material 101, and the first ion source 302 is used to assist the deposition. The $TiO_2$ particles are evaporated and deposited on the surface of the substrate 10 to form a $TiO_2$ layer with the thickness of 20 nm, when the substrate 10 is passing through the first vapor deposition area 331. After the first layer, $TiO_2$ film, is formed, the substrate 10 is transported into the second vapor deposition area 332. Then the second heating source 502 is used to heat the $SiO_2$ coating material 102, and the second ion source 303 is used to assist the deposition. The $SiO_2$ particles are evaporated and deposited on the surface of the substrate 10 to form a $SiO_2$ layer with the thickness of 42 nm, when the substrate 10 is passing through the second vapor deposition area 332. After the second layer, $SiO_2$ film, is formed, the substrate 10 is transported into the third vapor deposition area 333. Then the third heating source 503 is used to heat the $TiO_2$ coating material 101, and the third ion source 304 is used to assist the deposition. The $TiO_2$ layer with the thickness of 33 nm is formed. After the third layer, $TiO_2$ film, is formed, the substrate 10 is transported into the fourth vapor deposition area 334. Then the fourth heating source 504 is used to heat the SiO$_2$ coating material 102, and the fourth ion source 305 is used to assist the deposition. The SiO$_2$ layer with the thickness of 110 nm is formed. The antireflection films 2 are accomplished after the fourth layer is coated. Finally, the antireflection films 2 are rolled by the substrate rolling wheel 313.

More specifically, the optical monitoring system and the quartz monitoring device are used in the deposition process of this embodiment so as to monitor the thickness of the coated films and the deposition rate. The diameters of crucibles for the TiO$_2$ and SiO$_2$ coating materials 101 and 102 are 40 mm. The working and reacting gases are argon and oxygen with high purity, respectively. The working temperature is 25° C. The parameters of the vapor deposition conditions of this embodiment are listed in Table 1.

TABLE 1

| | Ion Source Power (W) | Ion Source Acceleration Voltage (V) | Working Temperature (°C.) | Coating Rate (angstrom/s) | Pressure |
|---|---|---|---|---|---|
| TiO$_2$ Film | 300 | 300 | 25 | 2 | $2.4 \times 10^{-4}$ |
| SiO$_2$ Film | 300 | 300 | 25 | 10 | $2.4 \times 10^{-4}$ |

Figure 5:
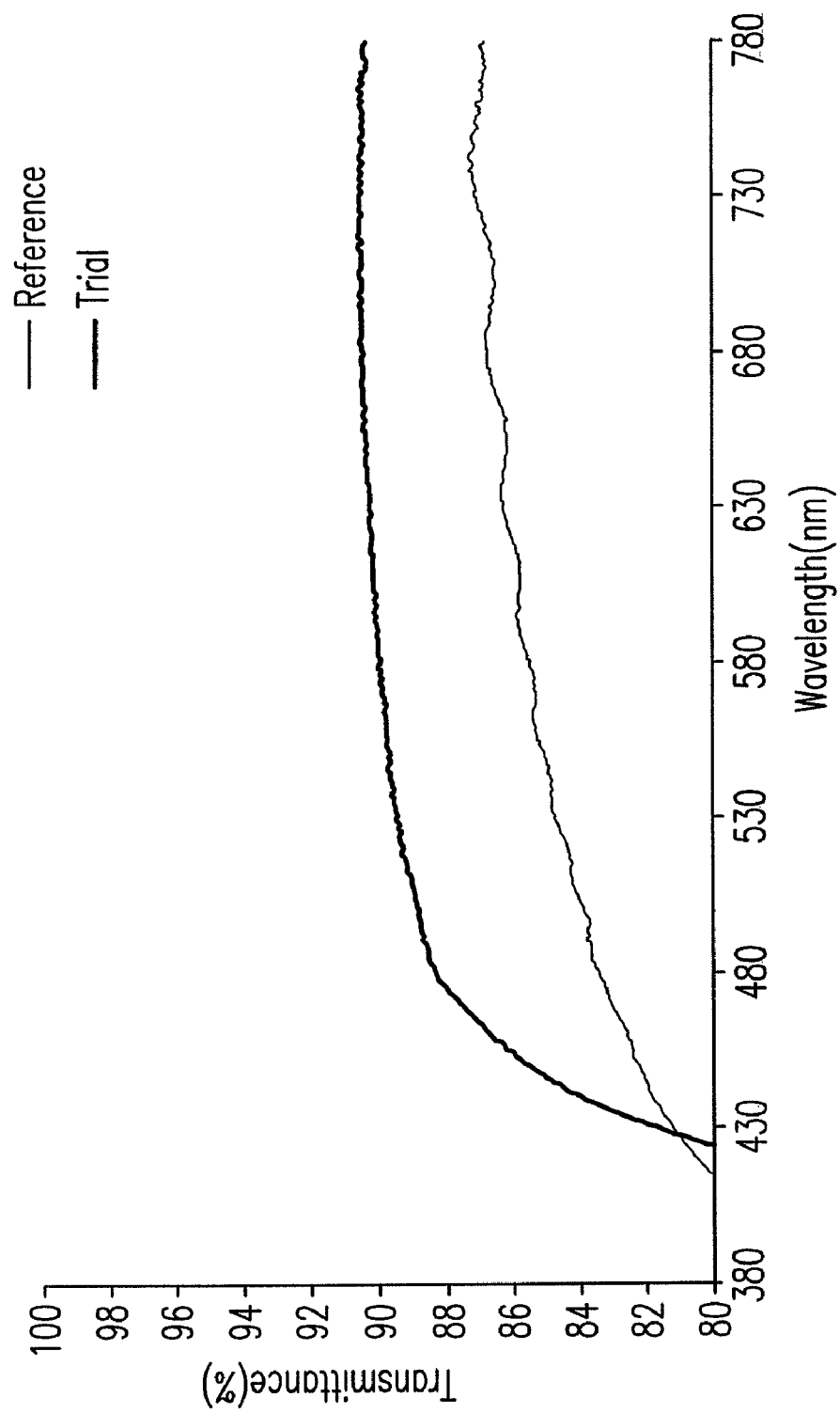
FIG. 5 is the schematic diagram showing the transmittance spectrum of the antireflection films according to the second embodiment of the present invention.

Please refer to FIG. 5, which is the schematic diagram showing the transmittance spectrum of the antireflection films according to the second embodiment of the present invention. The spectrum of the antireflection films according to the second embodiment of the present invention is denoted as the "Trial", while that of the uncoated substrate is denoted as the "Reference". As shown in FIG. 5, the transmittance of the Trial after the antireflection coating on a single surface is obviously raised by around 8% in the visible range. It can be derived that the transmittance for the antireflection coatings on both surfaces will be higher than 99%. If the antireflection coatings on both surfaces of the substrate are required, the substrate can be rolled on the reverse side, and the above-mentioned same deposition processes can be repeated for the antireflection films on the opposite surface of the substrate to obtain the double-faced antireflection films.

Figure 6:
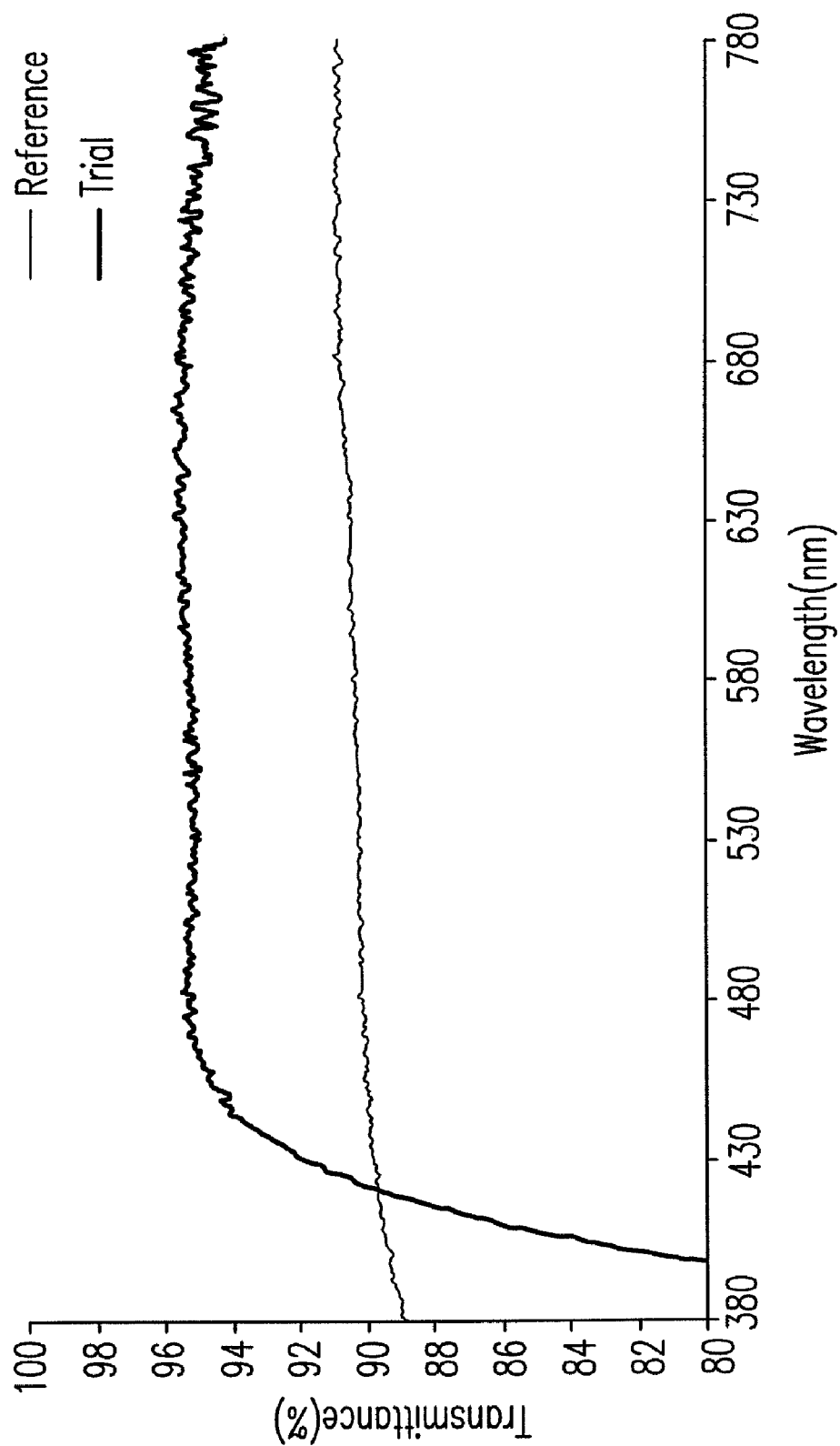
FIG. 6 is the schematic diagram showing the transmittance spectrum of the antireflection films according to the third embodiment of the present invention.

Please refer to FIG. 6, which is the schematic diagram showing the transmittance spectrum of the antireflection films according to the third embodiment of the present invention. The difference between the second and third embodiments is the substrate material. The plastic substrate is used in the second embodiment, while the glass substrate is used in the third embodiment. In FIG. 6, the spectrum of the antireflection films according to the third embodiment of the present invention is denoted as the "Trial", while that of the uncoated substrate is denoted as the "Reference". As shown in FIG. 6, the transmittance of the Trial after the antireflection coating on a single surface is prominently raised up to 94% in the visible range. If the antireflection films are coated on both surfaces, the more significant antireflection effect will be obtained.

The novel manufacturing method for the antireflection films is provided in the present invention, in which the ultra thin layers of TiO$_2$ and SiO$_2$ are stacked up to form the optical films. Not only the material cost can be reduced, but also the following described advantages can be obtained. The method of the present invention can greatly decrease the processing temperature, down to below 100° C. Therefore, the antireflection coating of the present invention can be widely applied to much more fields, specially to flexible substrates with low heat resistance. Moreover, the processing time can be dramatically reduced and the production efficiency can be greatly improved by largely decreasing the heating and cooling times. Thus, the present invention is capable of meeting the requirements of the continuous large-size mass production. The ultra thin TiO$_2$ layer is adopted in the present invention. The antireflection effect is not sacrificed by this ultra thin thickness. On the contrary, the transmittance of the antireflection films of the present invention can even reach 99% when both surfaces are antireflection-coated. Furthermore, according to the manufacturing method of the present invention, the existing coating companies do not need to purchase extra expensive machines. The antireflection films of the present invention can be produced by their current machines without extra financial burdens.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An antireflection structure, comprising:
   a substrate layer having a substrate refractive index;
   a first inorganic layer disposed on the substrate layer and having a first refractive index different from the substrate refractive index, wherein a thickness of the first inorganic layer is in a range of 1 to 40 nm;
   a second inorganic layer disposed on the first inorganic layer and having a second refractive index smaller than the first refractive index;
   a third inorganic layer disposed on the second inorganic layer, wherein the thickness of the third inorganic layer is in a range of 1 to 40 nm; and
   a fourth inorganic layer disposed directly on the third inorganic layer, wherein the first and the third inorganic layers consist of a first material, and the second and the fourth inorganic layers consist of a second material different from the first material.

2. An antireflection structure according to claim 1, wherein:
   the third inorganic layer has a third refractive index different from the second refractive index; and
   the fourth inorganic layer has a fourth refractive index different from the third refractive index.

3. An antireflection structure, comprising:
   a substrate layer having a substrate refractive index;
   a first transparent layer disposed on the substrate layer and having a first refractive index;
   a second transparent layer disposed on the first transparent layer and having a second refractive index;
   wherein the first refractive index is larger than the substrate refractive index and the second refractive index, and a thickness of the first transparent layer is in the range of 1 to 40 nm;
   a third transparent layer disposed on the second transparent layer, wherein the thickness of the third inorganic layer is in a range of 1 to 40 nm; and
   a fourth transparent layer disposed directly on the third transparent layer, wherein the first and the third transparent layers consist of a first material, and the second and the fourth transparent layers consist of a second material different from the first material.

4. An antireflection structure according to claim 3, wherein:
the third transparent layer has a third refractive index; and
the fourth transparent layer has a fourth refractive index,
the third refractive index is larger than the second and fourth refractive indexes.

5. An antireflection structure according to claim 4, wherein the third transparent layer is made of a metal oxide.

6. An antireflection structure according to claim 5, wherein the metal oxide is one selected from a group consisting of indium oxide, titanium dioxide, nickel oxide, chromium oxide, cadmium oxide, gallium indium oxide, diniobium pentaoxide, indium tin oxide, tin dioxide and a combination thereof.

7. An antireflection structure according to claim 4, wherein the fourth refractive index is smaller than the substrate refractive index.

8. An antireflection structure according to claim 4, further comprising a coating layer disposed between any two layers of the first, second, third and fourth transparent layers.

9. An antireflection structure according to claim 4, further comprising an adhesive layer disposed between any two layers of the first, second, third and fourth transparent layers.

10. An antireflection structure according to claim 4, wherein the third and fourth transparent layers are made by a method of a vapor deposition.

11. An antireflection structure according to claim 3, wherein the first transparent layer is made of a metal oxide.

12. An antireflection structure according to claim 11, wherein the metal oxide is one selected from a group consisting of indium oxide, titanium dioxide, nickel oxide, chromium oxide, cadmium oxide, gallium indium oxide, diniobium pentaoxide, indium tin oxide, tin dioxide and a combination thereof.

13. An antireflection structure according to claim 11, wherein the second refractive index is smaller than the substrate refractive index.

14. An antireflection structure according to claim 3, wherein the first and the second transparent layers are made by a method of a vapor deposition.

15. A method for manufacturing an antireflection structure, comprising steps of:
providing a substrate layer with a substrate refractive index;
forming a first transparent layer with a first refractive index on the substrate layer; and
forming a second transparent layer with a second refractive index on the first transparent layer,
wherein the first refractive index is larger than the substrate reactive index and the second refractive index, and a thickness of the first transparent layer is in the range of 1 to 40 nm; forming a third transparent layer on the second transparent layer, wherein the thickness of the third transparent layer is in a range of 1 to 40 nm;
forming a fourth transparent layer directly on the third transparent layer, wherein the first and the third transparent layers consist of a first material, and the second and fourth transparent layers consist of a second material different from the first material.

16. A method according to claim 15, further comprising
the third transparent layer has a third refractive index; and
the fourth transparent layer has a fourth refractive index,
wherein the third refractive index is larger than the second and the fourth refractive indexes.

17. A method according to claim 16, further comprising a step of forming a coating layer between any two layers.

18. A method according to claim 16, further comprising a step of forming an adhesive layer between any two layers.

19. A method according to claim 15, wherein a method of forming the first, the second, the third and the fourth transparent layers comprises at least one selected from a group consisting of a coating, a physical vapor deposition and a chemical vapor deposition methods.

20. A method according to claim 15, further comprising at least one of steps of:
forming a coating layer between any two layers; and
forming an adhesive layer between any two layers.

* * * * *